(12) United States Patent
Doan (10) Patent No.: US 9,343,639 B2
(45) Date of Patent: May 17, 2016

(54) LIGHT EMITTING DIODE (LED) DEVICE HAVING LENS PROTECTIVE STRUCTURE AND METHOD OF FABRICATION

(71) Applicant: SemiLEDS Optoelectronics Co., Ltd.

(72) Inventor: David T Doan, Hsinchu County (TW)

(73) Assignee: SemiLEDS Optoelectronics Co., Ltd., Chu-nan (TW)

( * ) Notice: Subject to any disclaimer, the term of this patent is extended or adjusted under 35 U.S.C. 154(b) by 0 days.

(21) Appl. No.: 14/093,173

(22) Filed: Nov. 29, 2013

(65) Prior Publication Data

US 2015/0155454 A1   Jun. 4, 2015

(51) Int. Cl.
  *H01L 33/00* (2010.01)
  *H01L 33/58* (2010.01)
  *H01L 33/60* (2010.01)

(52) U.S. Cl.
  CPC ............... *H01L 33/58* (2013.01); *H01L 33/60* (2013.01); *H01L 2933/0058* (2013.01)

(58) Field of Classification Search
  CPC ....... H01L 33/58; H01L 33/60; H01L 33/486; H01L 33/507; H01L 33/52; H01L 33/54; H01L 2933/0033; H01L 2933/0058
  USPC .................... 257/98, 99, 79; 438/27, 29, 26
  See application file for complete search history.

(56) References Cited

U.S. PATENT DOCUMENTS

| | | | |
|---|---|---|---|
| 4,727,457 A * | 2/1988 | Thillays | G02B 6/4204 257/E25.02 |
| 7,224,000 B2 * | 5/2007 | Aanegola et al. | 257/98 |
| 7,391,153 B2 * | 6/2008 | Suehiro et al. | 313/512 |
| 7,525,248 B1 * | 4/2009 | Fan | 313/512 |
| 7,859,193 B2 * | 12/2010 | Fukasawa | 315/158 |
| 8,853,712 B2 * | 10/2014 | Hussell et al. | 257/80 |
| 8,853,725 B2 * | 10/2014 | Tanuma | 257/98 |
| 2005/0239227 A1 * | 10/2005 | Aanegola et al. | 438/26 |
| 2006/0012299 A1 * | 1/2006 | Suehiro et al. | 313/512 |
| 2009/0200957 A1 * | 8/2009 | Fukasawa | 315/291 |
| 2012/0126269 A1 * | 5/2012 | Tanuma | 257/98 |
| 2013/0069089 A1 * | 3/2013 | Hussell et al. | 257/88 |

OTHER PUBLICATIONS

Born and Wolf, "Principles of optics", 2005, Cambridge University Press, pp. 43-45, Dec. 2005.*

* cited by examiner

*Primary Examiner* — Nikolay Yushin
(74) *Attorney, Agent, or Firm* — Stephen A. Gratton (57) ABSTRACT

A light emitting diode (LED) device includes a substrate, a light emitting diode (LED) die mounted to the substrate configured to emit electromagnetic radiation, a lens covering the (LED) die, and a lens protective structure configured to protect the lens and a lens bonding layer from electromagnetic radiation emitted by the light emitting diode (LED) die and from reflected electromagnetic radiation within the lens. The lens protective structure can also be configured to reflect electromagnetic radiation increasing light extraction from the (LED) device. A method for fabricating the (LED) device includes the step of forming an opaque lens protective structure on the lens or on the lens bonding layer configured to protect the lens and the lens bonding layer from electromagnetic radiation emitted by the light emitting diode (LED) die and from reflected electromagnetic radiation within the lens.

9 Claims, 6 Drawing Sheets

FIG. 6C

LIGHT EMITTING DIODE (LED) DEVICE HAVING LENS PROTECTIVE STRUCTURE AND METHOD OF FABRICATION

BACKGROUND

This disclosure relates generally to optoelectronic devices and more particularly to a light emitting diode (LED) device having a lens protective structure, and to a method for fabricating the (LED) device.

Figure 1:
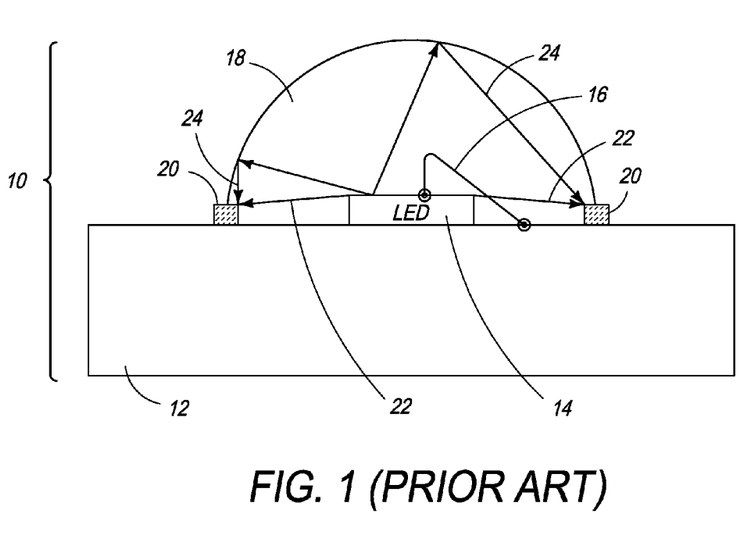
FIG. 1 is a schematic cross sectional view of a prior art light emitting diode (LED) device.

As shown in FIG. 1, a prior art light emitting diode (LED) device 10 includes a substrate 12, a (LED) die 14 electrically connected to the substrate 12 via a wire bonded wire 16, and a lens 18 covering the (LED) die 14. The lens 18 can comprise a transparent material deposited on the substrate 12, or a separate member bonded to the substrate 12. Typical materials for the lens 18 include silicone, epoxy and glass.

As also shown in FIG. 1, a bonding layer 20 can be used to attach the lens 18 to the substrate 12, and to seal the (LED) die 14 on the substrate 12. The bonding layer 20 can comprise a polymer (e.g., silicone, epoxy), a glass frit or a non-conductive adhesive film (NCF). The bonding layer 20 is bombarded by direct electromagnetic radiation 22 from the (LED) die 14 and by reflected electromagnetic radiation 24 from the lens 18. This electromagnetic radiation 22, 24 can damage the bonding layer 20 causing delamination of the lens 18 and attendant seal. Depending on the lens material, the electromagnetic radiation 22, 24 can also damage the lens 18 by yellowing or hazing. Electromagnetic radiation 22, 24 in the ultraviolet (UV) spectrum is particularly damaging to bonding layers 20 made of polymer materials. This damage can compromise the performance of the (LED) device 10, and in some cases can effectively render the (LED) device 10 as useless.

The present disclosure is directed to a light emitting diode (LED) device having a lens protective structure configured to protect the lens and a lens bonding layer from damage due to electromagnetic radiation. In addition, the lens protective structure is configured to reflect electromagnetic radiation increasing light extraction from the (LED) device. The present disclosure also provides a method for fabricating the light emitting diode (LED) device with the lens protective structure.

SUMMARY

A light emitting diode (LED) device includes a substrate; a light emitting diode (LED) die mounted to the substrate configured to emit electromagnetic radiation having a wavelength range; a lens bonded to the substrate configured to cover the die and transmit the electromagnetic radiation from the light emitting diode (LED) die; and a lens bonding layer configured to bond the lens to the substrate. The light emitting diode (LED) device also includes a lens protective structure on the lens and on the lens bonding layer comprising a material that is opaque to the electromagnetic radiation at the wavelength range. In addition, the lens protective structure is configured to protect the lens and the lens bonding layer from the electromagnetic radiation emitted by the light emitting diode (LED) die and from reflected electromagnetic radiation within the lens.

A method for fabricating the (LED) device includes the steps of providing a substrate; mounting a light emitting diode (LED) die mounted to the substrate configured to emit electromagnetic radiation having a wavelength range; forming a lens configured to cover the die and transmit the electromagnetic radiation from the light emitting diode (LED) die; and forming a lens bonding layer on the lens or the substrate configured to bond the lens to the substrate. The method also includes the step of forming a lens protective structure on the lens or on the lens bonding layer comprising a material that is opaque to the electromagnetic radiation at the wavelength range configured to protect the lens and the lens bonding layer from the electromagnetic radiation emitted by the light emitting diode (LED) die and from reflected electromagnetic radiation within the lens; and then bonding the lens to the substrate using the lens bonding layer.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 2A:
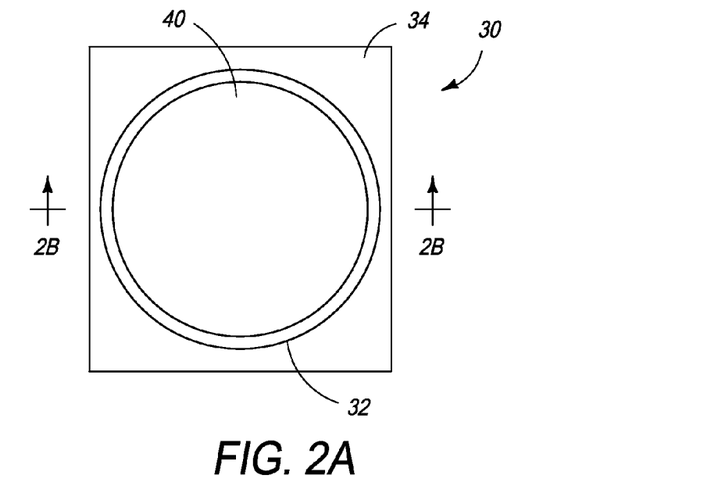
FIG. 2A is a schematic plan view of a light emitting diode (LED) device having a lens protective structure.
Figure 2B:
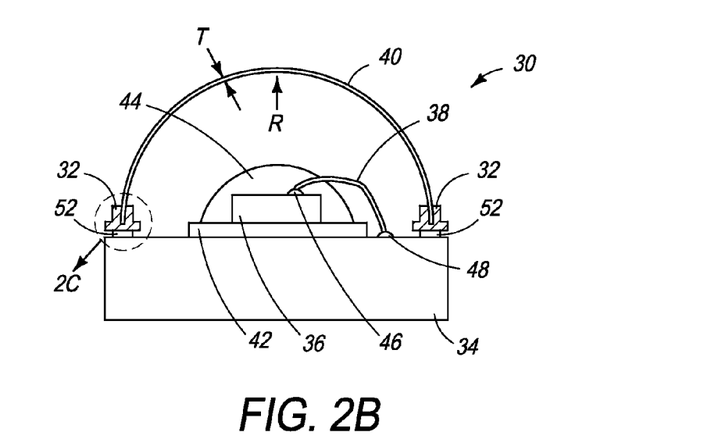
FIG. 2B is a schematic cross sectional view of the light emitting diode (LED) device taken along section line 2B-2B of FIG. 2A.

Referring to FIGS. 2A-2D, a light emitting diode (LED) device 30 having a lens protective structure 32 is illustrated. As shown in FIG. 2B, the light emitting diode (LED) device 30 includes a substrate 34; a light emitting diode (LED) die 36 mounted to the substrate 34 using a die attach layer 42; a wire 38 bonded to the light emitting diode (LED) die 36 and to the substrate 34; and a transparent lens 40 covering the light emitting diode (LED) die 36 configured to transmit the electromagnetic radiation. The light emitting diode (LED) device 30 also includes a wavelength converting layer 44 configured to convert the wavelength of the electromagnetic radiation produced by the a light emitting diode (LED) die 36 to produce a desired output for the device, such as white light having a selected color correlation temperature. Alternately, as will be further explained, the lens 40 can include a wavelength converting layer. In addition, although the light emitting diode (LED) device 30 is illustrated with a wire bonded wire 38 the device can comprise a flip chip device as well as other conventional devices.

The substrate 34 (FIG. 2B) functions as a mounting substrate, and also provides electrical conductors (not shown), electrodes (not shown) and electrical circuits (not shown) for electrically connecting the light emitting diode (LED) device 30 to the outside world. The substrate 34 can have a flat shape as shown or can have a convex shape or a concave shape. In addition, the substrate 34 can include a reflective layer (not shown) to improve light extraction. The substrate 34 can comprise silicon, or another semiconductor material such as GaAs, SiC, GaP, GaN or AlN. Alternately, the substrate 34 can comprise a ceramic material, sapphire, glass, a printed circuit board (PCB) material, a metal core printed circuit board (PCB), an FR-4 printed circuit board (PCB), a metal lead frame, an organic lead frame, a silicone submount substrate, or any packaging substrate used in the art. Further, the substrate 34 can comprise a single layer of metal or metal alloy layers, or multiple layers such as Si, AlN, SiC, AlSiC, diamond, MMC, graphite, Al, Cu, Ni, Fe, Mo, CuW, CuMo, copper oxide, sapphire, glass, ceramic, metal or metal alloy. In addition, the substrate 34 can have any polygonal shape (e.g., square, rectangular) and any suitable size. For example, the substrate 34 can be die-sized, such that the light emitting diode (LED) device 30 has a chip scale size similar to that of a chip scale package (CSP). Alternately, the substrate 34 can be wafer sized such that a wafer scale system with a plurality of light emitting diode (LED) dice 36 is provided. Further, the substrate 34 can have a desired thickness, with from 35 µm to 675 µm being representative.

The light emitting diode (LED) die 36 (FIG. 2B) can comprise a conventional LED, such as a vertical light emitting diode (VLED) die, or a planar light emitting diode (PLED) die configured to emit electromagnetic radiation over a selected wavelength range. For example, the light emitting diode (LED) die 36 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm). However, these wavelength ranges are merely exemplary and the light emitting diode (LED) die 36 (FIG. 2B) can have a wavelength as low as about 100 nm. Suitable light emitting diode (LED) dice are commercially available from SemiLEDS Optoelectronics Co. Ltd., located in Miao-Li County, Taiwan, R.O.C. The light emitting diode (LED) die 36 includes a die contact 46, and the wire 38 can be wire bonded to the die contact 46 and to a substrate contact 48 on the substrate 34. The die attach layer 42 can comprise a suitable die attach material such as solder, silver epoxy or another polymer.

The lens 40 (FIG. 2B) can comprise a transparent material such as silicone, sapphire, quartz, polymers, co-polymers, polymer based plastics, polycarbonate, glasses, polystyrene, AlO glass, AlON glass, spinel and other optically treated materials having transparency over the wavelength range of the electromagnetic radiation emitted by the light emitting diode (LED) die 36. In addition, the lens 40 comprises a hollow thinned walled structure having a desired shape (e.g., concave, hemispherical), wall thickness (T) and radius of curvature (R). As will be further explained, the lens 40 can comprise a separate member formed using a molding process, which is then bonded to the substrate 34. Alternately, as will be further explained, the lens 40 can comprise one or more layers of material formed on the substrate 34 using a suitable deposition process such as screen printing, dispensing, precise dispensing, spraying or jetting.

The wavelength converting layer 44 (FIG. 2B) on the light emitting diode (LED) die 36 can be configured to convert at least some of the electromagnetic radiation emitted by the light emitting diode (LED) die 36 into electromagnetic radiation having a different wavelength range, such as a higher wavelength range. For example, if the light emitting diode (LED) die 36 emits electromagnetic radiation in a blue spectral range, the wavelength converting layer 44 can be configured to convert at least some of this radiation to a yellow spectral range, such that the output of light emitting diode (LED) device 30 appears to be white light. Stated differently, the wavelength converting layer 44 converts input electromagnetic radiation in a first spectral region to output electromagnetic radiation in a second spectral region. Rather than being formed on the light emitting diode (LED) die 36, a wavelength converting layer can be formed directly on the lens 40. The wavelength conversion layer 44 can comprise a transparent base material such as a polymer, a glass, or a ceramic containing a wavelength conversion compound, such as a phosphor compound. In addition, the wavelength conversion compound can be incorporated into the base material, using a mixing process to form a viscous mixture. Exemplary base materials for the wavelength conversion material include silicone, epoxy, spin on glass (SOG), $SiO_2$, and $Al_2O_3$ in liquid or viscous form, which can be mixed with the wavelength conversion compound in a specific ratio. Exemplary wavelength conversion compounds for the wavelength conversion material include YAG:Ce, TAG:Ce, alkaline earth silicon nitride doped with Eu, alkaline earth silicate doped with Eu, or calcium scandate doped with Ce. However, it is to be understood that the light emitting diode (LED) die 36 (FIG. 2B) can be constructed without a wavelength converting layer 44, which is an optional additional element.

Figure 2C:
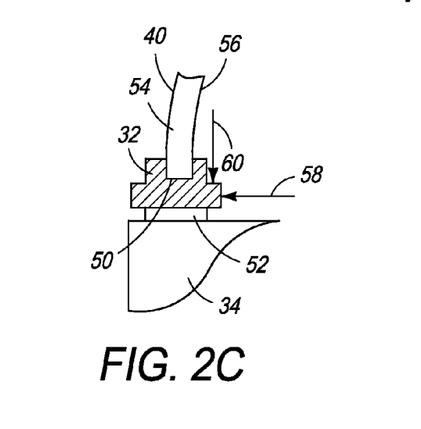
FIG. 2C is an enlarged portion of FIG. 2B taken along line 2C illustrating a lens protective structure on the light emitting diode (LED) device.

Referring to FIG. 2C, the lens protective structure 32 is shown in an enlarged view. The lens protective structure 32 can be formed along an inner peripheral edge 50 of the lens 40 in physical contact with a lens bonding layer 52 configured to attach the lens 40 to the substrate 34. The geometry and dimensions of the lens protective structure 32 including it's width, thickness and cross section can be selected to provide protection for the lens 40 and the lens bonding layer 52 from direct electromagnetic radiation 58 from the light emitting diode (LED) die 36 and reflected electromagnetic radiation 60 contained within the lens 40. This reflected electromagnetic radiation 60 is mainly produced by reflection from the lens 40 but can also be produced by other reflective surfaces within the lens 60.

As shown in FIG. 2C, the lens protective structure 32 can be configured to protect the peripheral edge 50 of the lens 40, and both the outer surface 54 and the inner surface 56 of the lens 40 proximate to the peripheral edge 50 of the lens 40 as well. As such, the lens protective structure 32 can include a u-shaped recess having a width that matches the thickness T of the lens 40. In addition to protecting the lens 40, the lens protective structure 32 can be configured to also protect the surface and sidewalls of the lens bonding layer 52. As such, the lens protective structure 32 can have a width that is equal to or larger than the width of the lens bonding layer 52.

The lens protective structure 32 (FIG. 2B) can comprise any material that is opaque to the electromagnetic radiation emitted by the light emitting diode (LED) die 36 and also reflective to the electromagnetic radiation. For example, the lens protective structure 32 can comprise a single metal layer or stack of a metal, such as Ag, Au, Cr, Pt, Pd, Al and alloys of these materials. Rather than a metal, the lens protective structure 32 can comprise a polymer that is opaque to the electromagnetic radiation emitted by the light emitting diode (LED) die 36. The lens bonding layer 52 can comprise a suitable lens attach material used in the art such as a frit, a metal, a non-conductive film (NCF) or an anisotropic conductive film (ACF), and variations thereof.

Figure 2D:
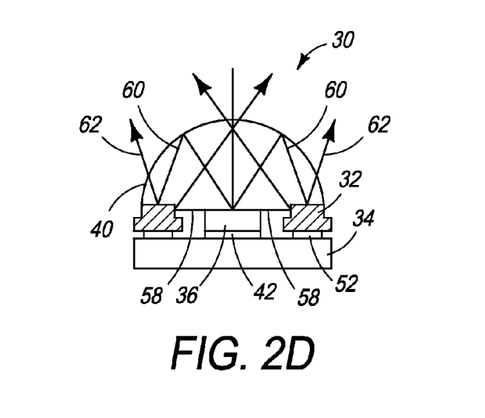
FIG. 2D is a schematic cross sectional view illustrating operational characteristics of the light emitting diode (LED) device.

Referring to FIG. 2D, operational characteristics of the light emitting diode (LED) device 30 are illustrated. The lens protective structure 32 protects the inner peripheral edge 50 of the lens 40 and the lens bonding layer 52 from direct electromagnetic radiation 58 emitted by the light emitting diode (LED) die 36 and from reflected electromagnetic radiation 60 contained within the lens 40. This prevents yellowing of the lens 40 and degradation of the lens bonding layer 52 and attendant lens seal, providing longer device endurance without lens lift off. This protection also allows the use of large area reflective layers on the light emitting diode (LED) die 36 without detriment to the lens 40 and lens bonding layer 52, which can be used to increase the output and light extraction of the light emitting diode (LED) device 30. In addition, the lens protective structure 32 produces additional reflected electromagnetic radiation 62, which further increases the output and light extraction of the light emitting diode (LED) device 30.

Figure 3A:
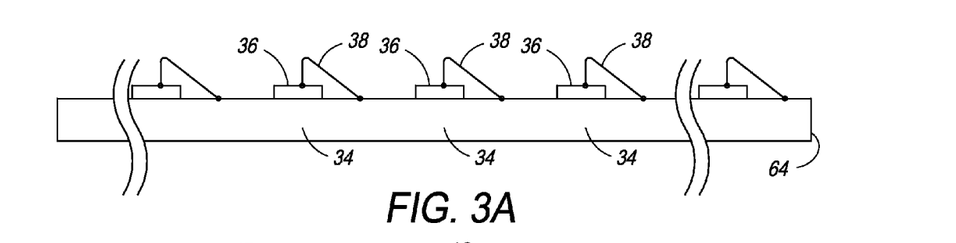
FIGS. 3A-3D are schematic cross sectional views illustrating steps in a method for fabricating a light emitting diode (LED) device with a lens protective structure.

Referring to FIGS. 3A-3D, steps in a wafer level method for fabricating the light emitting diode (LED) device 30 are illustrated. Although for illustrative purposes the steps of the method are shown in a particular order, the method can be practiced with a different order. In addition, the method can be performed at the die level rather than the wafer level. Initially, as shown in FIG. 3A, a wafer 64 can be provided. The material, geometry and components of the wafer 64 can be selected as required dependent on the requirements of the substrate 34 (FIG. 2B).

As shown in FIG. 3A, a light emitting diode mounting step can be performed to mount the light emitting diode (LED) dice 36 on the wafer 64. During this step, the die attach layers 42 (FIG. 2B) can be formed using a solder reflow process, a bumping process or a silver epoxy curing process to bond the light emitting diode (LED) dice 36 to the wafer 64.

As also shown in FIG. 3A, a wire bonding step can be performed in which the wires 38 are wire bonded to the to the die contacts 46 on the light emitting diode (LED) dice 36 and to substrate contacts 48 for the substrates 34 on the wafer 64. The wire bonding step can be performed using conventional wire bonding equipment. As previously mentioned, the wire bonding step can be eliminated for flip chip devices and other conventional devices.

Figure 4A:
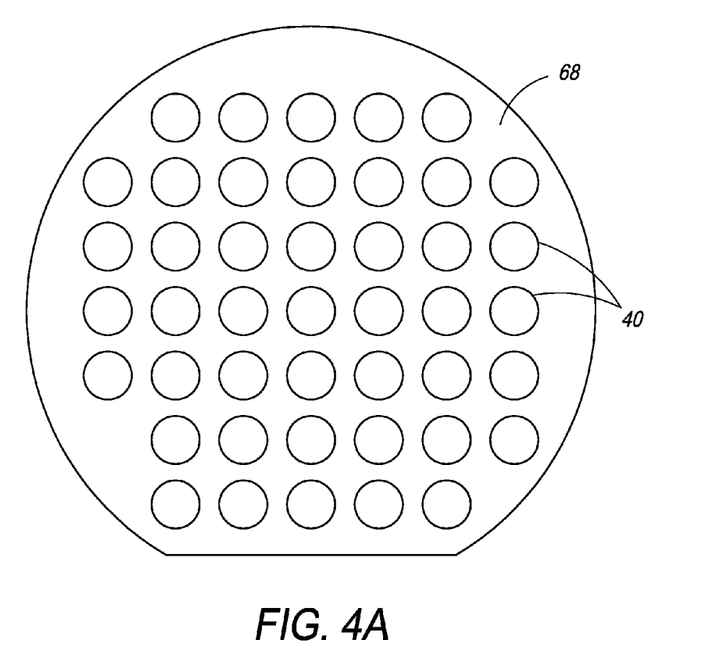
FIG. 4A is a schematic bottom view taken along line 4A-4A of FIG. 3B showing a lens panel containing multiple lens.

Although not shown in FIG. 3A, a wavelength converting layer 44 forming step can also be performed. The wavelength converting layers 44 can comprise a fluorescent material, such as a phosphor based material, which can be deposited using a suitable process such as spin on, dispensing or spray on and then patterned to cover the light emitting diode (LED) dice 36. As another alternative, as shown in FIG. 4C, a wavelength converting layer 66 can optionally be formed on the inner surfaces 56 of the lenses 40.

Figure 3B:
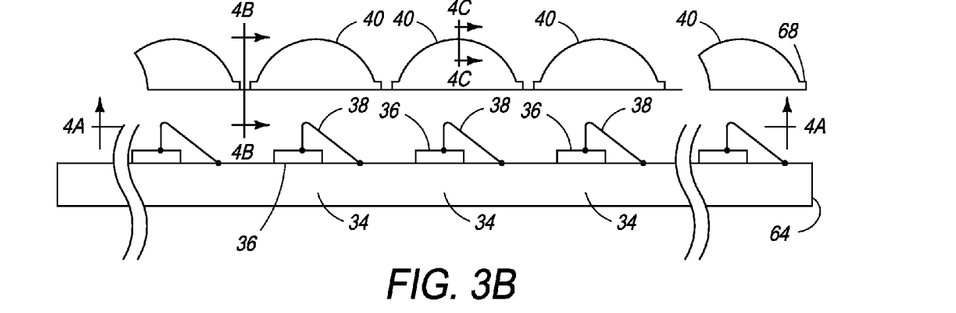

Next, as shown in FIG. 3B, a lens forming step can be performed to form the lenses 40. As shown in FIG. 4A, multiple lenses 40 can be formed on a panel 68. For example, the panel 68 can comprise a suitable polymer (e.g., silicone, polycarbonate), which is injected molded to form the lenses 40. In the case of other materials, such as sapphire, quartz, or glass a suitable process such as glass blowing can be used to form the lenses 40 out of these materials. In any case, the placement of the lenses 40 on the panel 68 matches the location of the light emitting diode (LED) dice 36 on the wafer 64. Alternately, rather than being formed on a separate panel 68 the lenses 40 can be molded directly on the wafer 64.

Figure 4B:
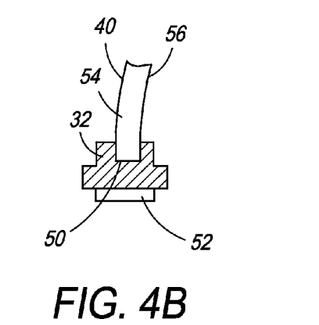
FIG. 4B is an enlarged schematic cross sectional view taken along section line 4B-4B of FIG. 3B illustrating the protective structure and lens bonding layer on the lens.
Figure 4C:
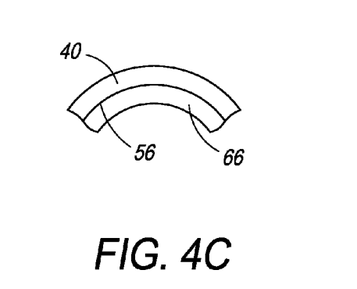
FIG. 4C is an enlarged schematic cross sectional view taken along section line 4C-4C of FIG. 3B illustrating a wavelength converting layer on the lens.

As shown in FIG. 4B, the lenses 40 on the panel 68 can also include the lens protective structures 32. The lens protective structures 32 can be formed along the inner peripheral edges 50 of the lenses 40 using a suitable deposition process such as sputtering, PVD, CVD, evaporation or electroless chemical deposition. The lens protective structure 32 can comprise a single metal layer or stack of a metal, such as Ag, Au, Cr, Pt, Pd, Al and alloys of these metals. In addition, the deposition process can be controlled to form the lens protective structures 32 with a suitable geometry.

As also shown in FIG. 4B, the lens bonding layers 52 can be formed on the lens protective structures 32 using a suitable deposition process such as a stenciling process, a screen printing process, a spin resist process, a dry film process, a stereographic lithographic process, or a CVD process. In addition, the lens bonding layers 52 can comprise a suitable adhesive such as a frit, a metal, a non-conductive film (NCF) or an anisotropic conductive film (ACF), and variations thereof.

Figure 3C:
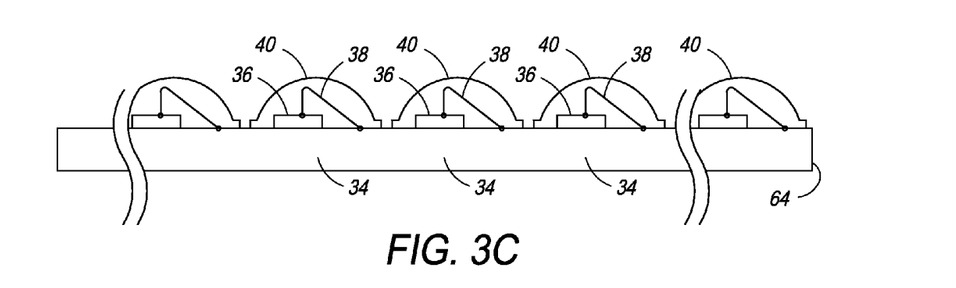

Next, as shown in FIG. 3C, a placing and curing step can be performed to place the panel 68 containing the lenses 40 on the wafer 64 and to cure the lens bonding layers 52.

Figure 3D:
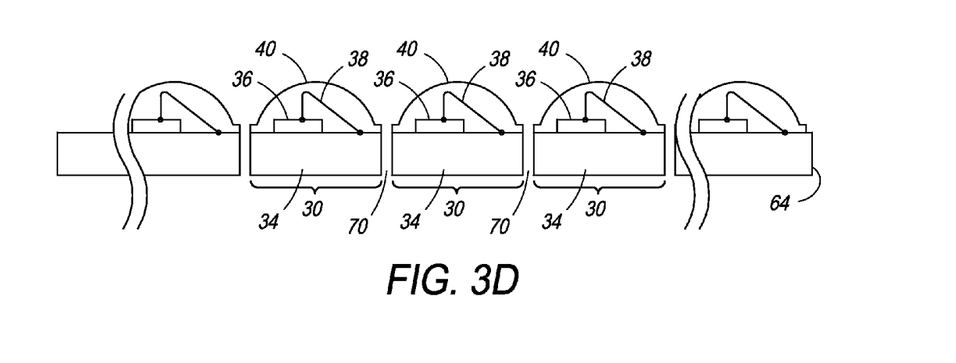

Next, as shown in FIG. 3D, a singulation step can be performed to singulate the wafer 64 into a plurality of light emitting diode (LED) devices 30. The singulation process is also referred to in the art as dicing. The singulation step can be performed using a process such as lasering, sawing, water jetting or etching, in which the individual light emitting diode (LED) device 30 are separated along singulation grooves 70.

Figure 5A:
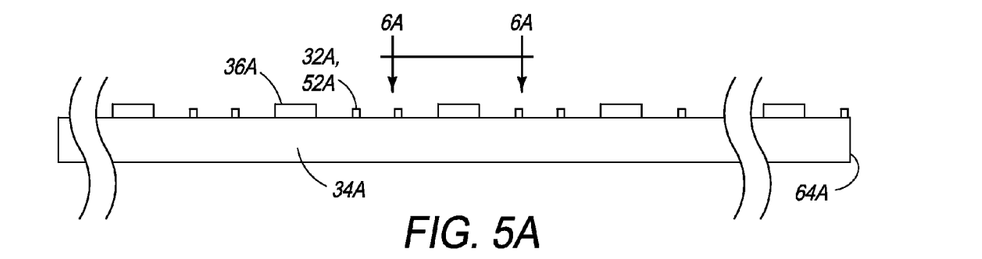
FIGS. 5A-5D are schematic cross sectional views illustrating steps in a method for fabricating a light emitting diode (LED) device with a lens protective structure using a deposition process.
Figure 5B:
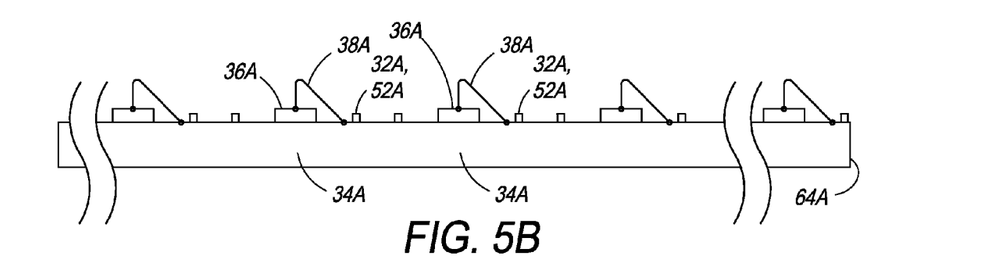

Referring to FIGS. 5A-5D, steps in a wafer level method for fabricating a light emitting diode (LED) device 30A (FIG. 5D) having a deposited lens 40A (FIG. 5D) are illustrated. Although for illustrative purposes, the steps of the method are shown in a particular order, the method can be practiced with a different order. In addition, the method can be performed at the die level rather than the wafer level. Initially, as shown in FIG. 5A, a wafer 64A can be provided having a plurality of substrates 34A. As also shown in FIG. 5A, a light emitting diode mounting step can be performed to mount light emitting diode (LED) dice 36A on the wafer 64A.

Figure 6A:
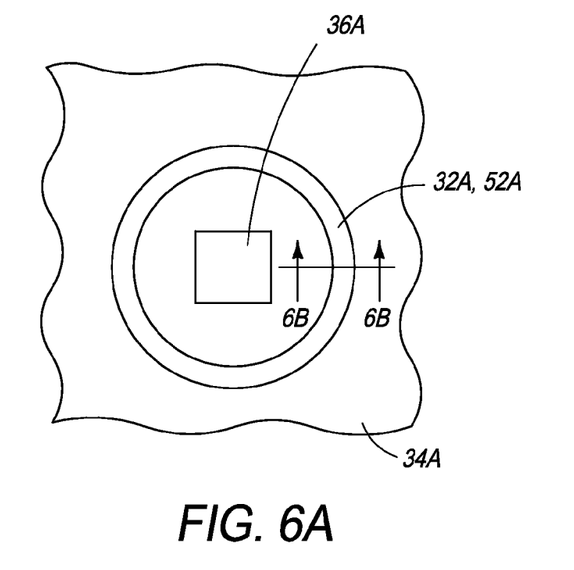
FIG. 6A is an enlarged schematic plan view of portion of FIG. 2B taken along line 6A-6A of FIG. 5A illustrating a deposited lens protective structure.
Figure 6B:
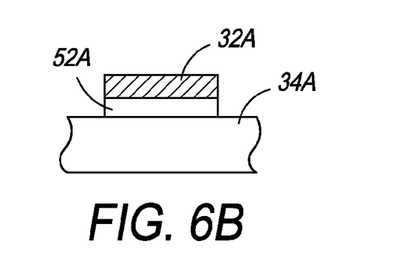
FIG. 6B is a schematic cross sectional view taken along section line 6B-6B of FIG. 6A illustrating the lens protective structure and lens bonding layer.
Figure 6C:
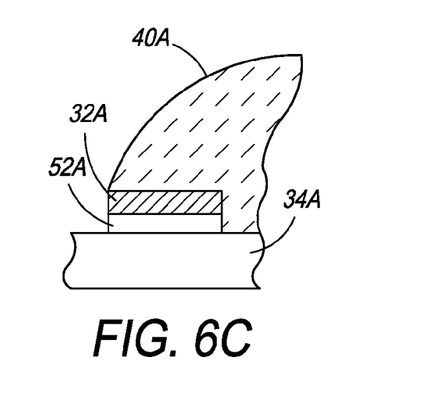
FIG. 6C is an enlarged schematic cross sectional view taken along line 6C of FIG. 5C illustrating a deposited lens.

As shown in FIGS. 6A and 6B, a lens bonding layer 52A and a lens protective structure 32A can be formed for each die 36A and each substrate 34A using a suitable deposition process. For example, the lens bonding layer 52A can be formed on each substrate 34A using a stenciling process, a screen printing process, a spin resist process, a dry film process, a stereographic lithographic process, or a CVD process. The lens protective structure 32A can be formed for each die 36A on each substrate 34A using sputtering, PVD, CVD, evaporation or electroless chemical deposition.

Figure 5C:
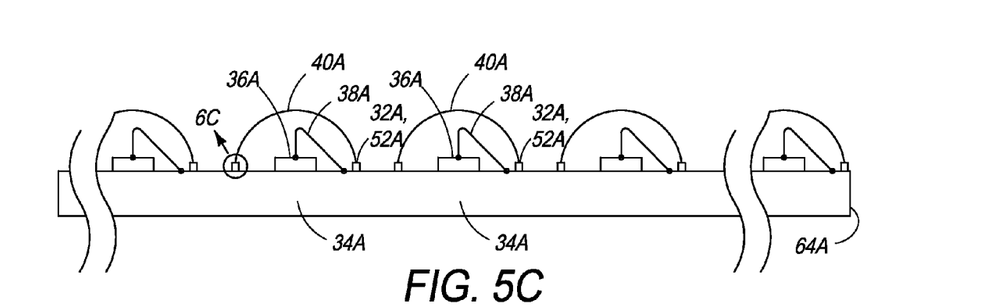

Next, as shown in FIG. 5C, a lens 40A for each die 36A and each substrate 34A using a deposition process such as an in situ molding process.

Figure 5D:
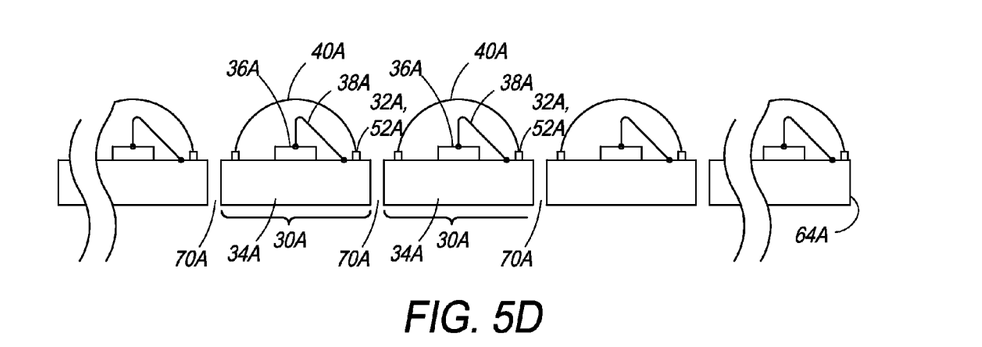

Next, as shown in FIG. 5D, a singulation step can be performed to singulate the wafer 64A into a plurality of light emitting diode (LED) devices 30A. The singulation step can be performed using a process such as lasering, sawing, water jetting or etching, in which the individual light emitting diode (LED) device 30A are separated along singulation grooves 70A.

Thus the disclosure describes an improved light emitting diode (LED) device and method of fabrication. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A light emitting diode (LED) device comprising:
a substrate having a surface;
a light emitting diode (LED) die mounted to the surface of the substrate configured to emit electromagnetic radiation having a wavelength range;
a lens having a peripheral edge bonded to the surface of the substrate configured to cover the light emitting diode (LED) die and transmit the electromagnetic radiation from the light emitting diode (LED) die;
a lens bonding layer on the surface of the substrate configured to bond the lens to the substrate; and
a lens protective structure on the peripheral edge of the lens and on the lens bonding layer, the lens protective structure comprising a reflective material that is opaque to the electromagnetic radiation at the wavelength range, the lens protective structure in physical contact with and covering the lens bonding layer such that some of the electromagnetic radiation emitted by the light emitting diode (LED) die and some reflected electromagnetic radiation within the lens are reflected by the lens protective structure and transmitted out of the lens increasing an output of the light emitting diode (LED) device and protecting the peripheral edge of the lens and the lens bonding layer,
wherein the lens protective structure includes a u-shaped recess having a width that matches a thickness of the lens.

2. A light emitting diode (LED) device comprising:
a substrate;
a light emitting diode (LED) die mounted to the substrate configured to emit electromagnetic radiation having a wavelength range;
a lens bonded to the substrate configured to cover the light emitting diode (LED) die and transmit the electromagnetic radiation from the light emitting diode (LED) die;
a lens bonding layer between the lens and the substrate configured to bond the lens to the substrate; and
a lens protective structure on the peripheral edge of the lens and on the lens bonding layer, the lens protective structure comprising a reflective material that is opaque to the electromagnetic radiation at the wavelength range, the lens protective structure in physical contact with and covering the lens bonding layer such that some of the electromagnetic radiation emitted by the light emitting diode (LED) die and some reflected electromagnetic radiation within the lens are reflected from the lens protective structure and transmitted out of the lens increasing an output of the light emitting diode (LED) device and protecting the peripheral edge of the lens and the lens bonding layer,
wherein the lens protective structure comprises a deposited material on the lens having a u-shaped recess with a width that matches a thickness of the lens and contacts both an outer surface and an inner surface of the lens proximate to the peripheral edge thereof.

3. The light emitting diode (LED) device of claim 2 wherein the lens protective structure comprises a metal or a stack of metals.

4. The light emitting diode (LED) device of claim 2 wherein the lens protective structure comprises a metal selected from the group consisting of Ag, Au, Cr, Pt, Pd, and alloys thereof.

5. The light emitting diode (LED) device of claim 2 wherein the lens comprises a material selected from the group consisting of silicone, sapphire, quartz, polymers, co-polymers, polymer based plastics, polycarbonate, glasses, polystyrene, AlO glass, AlON glass and spinel.

6. The light emitting diode (LED) device of claim 2 wherein the lens bonding layer comprises a material selected from the group consisting of a frit, a metal, a non-conductive film (NCF) and an anisotropic conductive film (ACF).

7. The light emitting diode (LED) device of claim 2 wherein the lens includes a wavelength converting layer configured to convert a wavelength of the electromagnetic radiation to another wavelength.

8. The light emitting diode (LED) device of claim 2 further comprising a wavelength converting layer on the light emitting diode (LED) die configured to convert a wavelength of the electromagnetic radiation to another wavelength.

9. A method for fabricating a light emitting diode (LED) device comprising:
providing a substrate having a surface;
mounting a light emitting diode (LED) die to the surface of the substrate configured to emit electromagnetic radiation having a wavelength range;
forming a lens having a peripheral edge configured to cover the light emitting diode (LED) die and transmit the electromagnetic radiation from the light emitting diode (LED) die;
forming a lens protective structure on the peripheral edge of the lens comprising a reflective material that is opaque to the electromagnetic radiation at the wavelength range;
forming a lens bonding layer on the lens or on the substrate configured to bond the lens to the substrate; and
bonding the lens to the substrate using the lens bonding layer with the lens protective structure in physical contact with and covering the lens bonding layer such that some of the electromagnetic radiation emitted by the light emitting diode (LED) die and some reflected electromagnetic radiation within the lens are reflected by the lens protective structure and transmitted out of the lens increasing an output of the light emitting diode (LED) device and protecting the peripheral edge of the lens and the lens bonding layer,
wherein the forming the lens protective structure step comprises depositing a metal on the peripheral edge of the lens.

\* \* \* \* \*